United States Patent
Kwon et al.

(10) Patent No.: US 10,523,200 B2
(45) Date of Patent: Dec. 31, 2019

(54) PROXIMITY SENSOR (71) Applicants: Hyundai Motor Company, Seoul (KR); Kia Motors Corporation, Seoul (KR)

(72) Inventors: Gideok Kwon, Seoul (KR); Seok Jun Oh, Seoul (KR); Moo Yong Kim, Gyeonggi-do (KR); Donghee Seok, Gyeonggi-do (KR); Jong Bok Lee, Gyeonggi-do (KR); HeeJin Ro, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/838,618

(22) Filed: Dec. 12, 2017

(65) Prior Publication Data

US 2019/0115917 A1 Apr. 18, 2019

(30) Foreign Application Priority Data

Oct. 12, 2017 (KR) ........................ 10-2017-0132167

(51) Int. Cl.
*G08B 21/00* (2006.01)
*H03K 17/955* (2006.01)
*H03K 17/96* (2006.01)
*B60K 35/00* (2006.01)
*H03K 17/945* (2006.01)

(52) U.S. Cl.
CPC .......... *H03K 17/955* (2013.01); *B60K 35/00* (2013.01); *H03K 17/96* (2013.01); *B60K 2370/141* (2019.05); *B60K 2370/1438* (2019.05); *H03K 2017/9455* (2013.01); *H03K 2017/9606* (2013.01); *H03K 2217/960755* (2013.01)

(58) Field of Classification Search
CPC ................. H03K 17/955; H03K 17/96; H03K 2017/9455; H03K 2017/9606; H03K 2217/960755; B60K 35/00; B60K 2350/1012; B60K 2350/1028
See application file for complete search history.

(56) References Cited

U.S. PATENT DOCUMENTS 6,774,505 B1 * 8/2004 Wnuk ................. B60N 2/0228
307/10.8
7,447,575 B2 * 11/2008 Goldbeck ............. G06F 3/0488
701/36

(Continued)

FOREIGN PATENT DOCUMENTS

JP 2004-127097 A 4/2004
JP 2007-055551 A 3/2007

(Continued)

*Primary Examiner* — Quang Pham
(74) *Attorney, Agent, or Firm* — Mintz Levin Cohn Ferris Glovsky and Popeo, P.C.; Peter F. Corless (57) ABSTRACT

A proximity sensor is provided. The proximity sensor has an exposed exterior surface formed of a metal material to improve the aesthetics thereof. The proximity sensor mounted within a vehicle includes a frame formed of a nonconductive material and a metal layer that covers an exterior surface of the frame. A sensor electrode contacts the metal layer and a sensor integrated circuit (IC) connected to the sensor electrode to sense an approach or a contact of a user on the metal layer.

6 Claims, 12 Drawing Sheets

(56) References Cited

U.S. PATENT DOCUMENTS

| | | | | |
|---|---|---|---|---|
| 8,032,280 B2* | 10/2011 | Shibata | ............... | H01H 13/705 307/10.8 |
| 8,454,062 B2* | 6/2013 | Rohlfing | ................ | E05B 81/78 292/336.3 |
| 2002/0037605 A1* | 3/2002 | Ninomiya | .......... | H01L 21/6835 438/125 |
| 2006/0238517 A1* | 10/2006 | King | .................... | G06F 1/1626 345/173 |
| 2008/0169936 A1* | 7/2008 | Pickering | ............. | G06F 1/3203 340/657 |
| 2009/0235588 A1* | 9/2009 | Patterson | ............... | G01V 3/088 49/26 |
| 2010/0271049 A1* | 10/2010 | Van Gastel | ............. | E05B 81/78 324/679 |
| 2011/0067759 A1* | 3/2011 | Park | ............... | H01L 31/022433 136/261 |
| 2012/0092251 A1* | 4/2012 | Hashimoto | ........... | B60K 35/00 345/156 |
| 2012/0161795 A1* | 6/2012 | Pfau | .................... | H03K 17/962 324/679 |
| 2012/0217145 A1* | 8/2012 | Yi | .......................... | G06F 3/044 200/5 A |
| 2012/0256844 A1* | 10/2012 | Takeda | ................. | G06F 3/0202 345/170 |
| 2013/0076121 A1* | 3/2013 | Salter | .................. | H03K 17/955 307/9.1 |
| 2013/0135540 A1* | 5/2013 | Nam | ................ | G02F 1/136286 349/12 |
| 2014/0055193 A1* | 2/2014 | Park | ....................... | H03K 17/96 327/517 |
| 2014/0306724 A1* | 10/2014 | Dassanayake | ....... | H03K 17/955 324/658 |
| 2014/0327454 A1* | 11/2014 | Menard | ................... | E05B 81/77 324/679 |
| 2015/0138801 A1* | 5/2015 | Salter | ....................... | B60Q 3/54 362/510 |
| 2015/0199041 A1* | 7/2015 | Salter | ...................... | G06F 3/042 345/174 |
| 2016/0193976 A1 | 7/2016 | Wild et al. | | |
| 2016/0216803 A1* | 7/2016 | Tanaka | .................. | H03K 17/9622 |
| 2016/0230441 A1* | 8/2016 | Sieg | ........................ | E05F 15/73 |
| 2016/0349906 A1* | 12/2016 | Lee | ........................ | G06F 3/0416 |
| 2016/0357287 A1* | 12/2016 | Bannai | .................. | G06F 3/044 |
| 2017/0068383 A1* | 3/2017 | Chern | .................. | G06F 3/0416 |
| 2017/0138997 A1* | 5/2017 | Wuerstlein | ............. | G01R 31/04 |
| 2017/0227119 A1* | 8/2017 | Buttolo | ................... | F16H 59/12 |
| 2018/0065556 A1* | 3/2018 | Boehm | ..................... | B60R 1/12 |
| 2019/0010735 A1* | 1/2019 | Kanematsu | ............. | E05B 81/76 |

FOREIGN PATENT DOCUMENTS

| | | |
|---|---|---|
| JP | 2008-513268 A | 5/2008 |
| JP | 2010-235035 A | 10/2010 |
| KR | 10-2016-0008289 | 1/2016 |
| KR | 10-1262599 | 1/2016 |

* cited by examiner

PROXIMITY SENSOR

CROSS-REFERENCE TO RELATED APPLICATION

This application claims the benefit of Korean Patent Application No. 10-2017-0132167, filed on Oct. 12, 2017, the disclosure of which is incorporated herein by reference.

BACKGROUND

1. Field of the Disclosure

The present disclosure relates to a proximity sensor for a vehicle, and more particularly, to a capacitive type proximity sensor.

2. Description of the Related Art

Proximity sensors are devices that sense the approach of an object and are used in various technical fields. For example, a proximity sensor is disposed in an input device that controls audio, video, navigation, air conditioning, and the like of the vehicle, and detects the proximity of the user's finger or the like. To meet the needs of consumers who prefer metal materials, attempts have been made to provide an exterior of an input device disposed within a vehicle using the metal material.

However, in the case of an infrared proximity sensor disposed within a vehicle, when an impermeable substance, such as a metal, is disposed in front of the infrared proximity sensor, an infrared ray does not pass through the impermeable substrate. Accordingly, the infrared proximity sensor fails to perform the function thereof. Additionally, the infrared proximity sensor includes a volume of an infrared sensor module that is relatively large, therefore a separate space is required to install the infrared sensor module.

The contents described as the related art have been provided merely for assisting in the understanding for the background of the present disclosure and should not be considered as corresponding to the related art known to those skilled in the art.

SUMMARY

The present disclosure provides a proximity sensor having an exterior formed of a metal material to improve the aesthetics thereof. The proximity sensor may be capable of being designed with a simplified structure. The proximity sensor may provide improved space utilization because a separate installation space is not required and improved material selection increases the design freedom.

In an aspect of an exemplary embodiment of the present disclosure, a proximity sensor mounted within a vehicle may include a frame formed of a nonconductive material, a metal layer disposed to cover an exterior surface of the frame, a sensor electrode configured to contact the metal layer, and a sensor integrated circuit (IC) connected to the sensor electrode and configured to sense an approach (e.g., of a user's hand) or a contact (e.g., touch of a user's finger) of an input device on the metal layer.

In some exemplary embodiments, the proximity sensor may further include a primer layer disposed between the metal layer and the exterior surface of the frame. The sensor electrode may be disposed between the primer layer and the exterior surface of the frame. The sensor electrode may be disposed between the metal layer and the exterior surface of the frame.

In other exemplary embodiments, the frame may include a metal complex and the sensor electrode may be formed by metallizing an electrode groove formed by irradiating the frame with a laser. The metal layer may be formed by plating or deposition of a metal on the exterior surface of the frame. At least a portion of the sensor electrode may be formed on a flexible printed circuit board.

In accordance with another aspect of an exemplary embodiment of the present disclosure, a proximity sensor mounted within a vehicle may include a frame formed of a nonconductive material, a metal layer disposed to cover an exterior surface of the frame, a sensor electrode spaced a predetermined distance from the metal layer, and a sensor integrated circuit (IC) connected to the sensor electrode and configured to sense an approach (e.g., of a user's hand to) toward or a contact (e.g., a touch of a user's finger) on the metal layer.

Additionally, the frame may include a metal complex and the sensor electrode may be formed by metallizing an electrode groove formed by irradiating an interior surface of the frame with a laser. The proximity sensor may further include a panel coupled to the frame and may have a printed circuit board (PCB) on which the sensor integrated circuit (IC) is mounted. The panel may include a metal complex and the sensor electrode may be formed by metallizing an electrode groove formed by irradiating the panel with a laser.

The proximity sensor may further include a sensor electrode base including the sensor electrode and coupled to the panel. The sensor electrode base may include a metal complex and the sensor electrode may be formed by metallizing an electrode groove formed by irradiating the sensor electrode base with a laser. The metal layer may be formed by plating or deposition of a metal on the exterior surface of the frame. The sensor electrode may be formed on a flexible printed circuit board.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Although an exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Reference will now be made in detail to the exemplary embodiments of the present disclosure, examples of which are illustrated in the accompanying drawings, wherein like reference numerals refer to like elements throughout.

Figure 1:
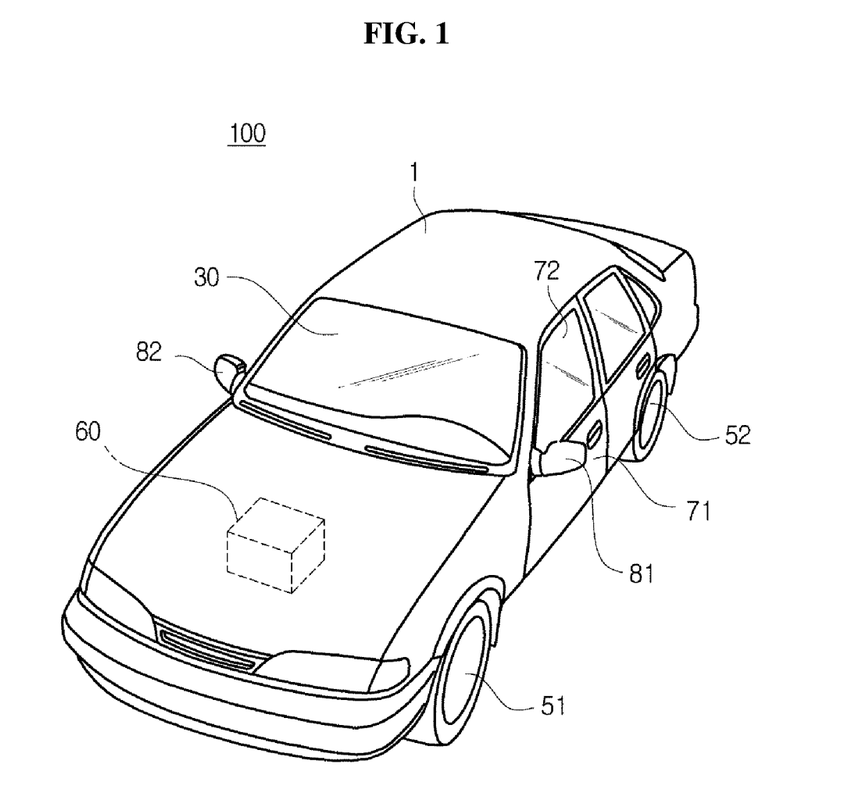
FIG. 1 is an exemplary view illustrating an exterior of a vehicle in accordance with an exemplary embodiment of the present disclosure.

FIG. 1 is an exemplary view illustrating an exterior of a vehicle in accordance with an exemplary embodiment of the present disclosure. Referring to FIG. 1, a vehicle 100 may include a main body 1 that forms an exterior of the vehicle 100, a front glass 30 that provides a driver with a field of vision in a forward direction of the vehicle 100, wheels 51 and 52 for moving the vehicle 100, a driving device 60 configured to rotate the wheels 51 and 52, doors 71 for shielding an interior of the vehicle 100 from the exterior, and side mirrors 81 and 82 that provide the driver with a field of vision in a rear direction of the vehicle 100. The front glass 30 is disposed at a front upper side of the main body 1 to enable a driver within the vehicle 100 to obtain visual information in front of the vehicle 100. The front glass 30 may be referred to as windshield glass.

The wheels 51 and 52 may include a front wheel 51 disposed at a front side of the vehicle 100 and a rear wheel 52 disposed at a rear side of the vehicle 100. The driving device 60 may be configured to provide a rotational force to the front wheel 51 or the rear wheel 52 to enable the main body 1 to travel in a front-rear direction. A driving device 60 may include an engine configured to generate the rotational force by burning a fossil fuel or a motor configured to generate the rotational force by receiving power from an electric condenser (not shown).

The doors 71 may be rotatably disposed at right and left sides of the main body 1 to enable the driver or passenger to enter the vehicle 100 when opening the doors 71. When the doors 71 are closed, the interior of the vehicle 100 is shielded from the exterior by the doors 71. The doors 71 may include windows 72 to allow an occupant to view the exterior or to allow a person to view the interior of the vehicle 100 from the exterior. In some exemplary embodiments, the windows 72 may be designed to enable the exterior or the interior of the vehicle to be viewed from one side, and may be provided to be opened and closed. The side mirrors 81 and 82 may include a left side mirror 81 disposed at a left side of the main body 1 and a right side mirror 82 disposed at a right side of the vehicle 100. The side mirrors 81 and 82 may allow a driver within the vehicle 100 to obtain visual information from the lateral sides and the rear side of the vehicle 100.

Figure 2:
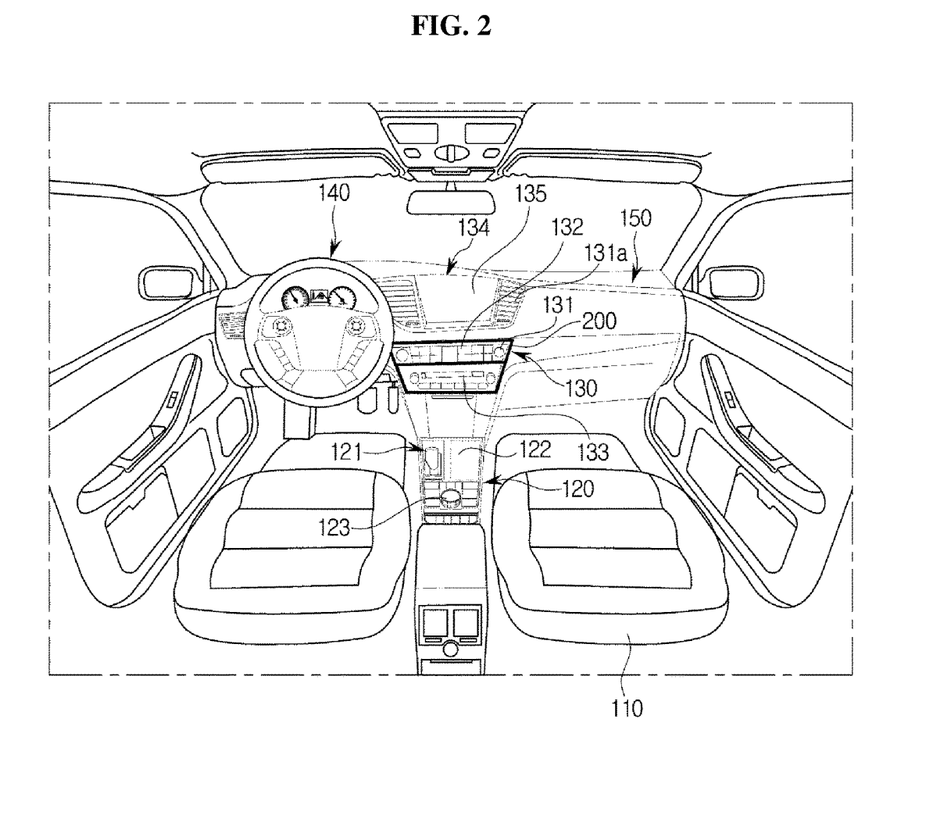
FIG. 2 is an exemplary view illustrating an interior of the vehicle in accordance with an exemplary embodiment of the present disclosure.

FIG. 2 is an exemplary view illustrating an interior of the vehicle in accordance with an exemplary embodiment of the present disclosure. Referring to FIG. 2, the vehicle 100 may include seats 110, a gear box 120, a center fascia 130, a dashboard 150 having a steering wheel 140, etc. The gear box 120 may include a shift lever 121 for shifting gears of the vehicle 100 and a touch pad 122 for configured to execute the operation of the vehicle 100. In addition, a dial manipulator 123 may be optionally installed. The center fascia 130 may be equipped with an air conditioner 131, a clock 132, an audio device 133, an audio video navigation (AVN) device 134, etc.

The air conditioner 131 may be configured to adjust a temperature, humidity, air cleanliness, and an air flow inside the vehicle 100 to maintain the interior of the vehicle 100 at the desired temperature. The air conditioner 131 may include at least one discharge port 131a disposed in the center fascia 130 to discharge air. The center fascia 130 may include buttons or dials for configured to operate the air conditioner 131 and the like. A user such as a driver may operate the air conditioner 131 using the buttons disposed on the center fascia 130. The clock 132 may be disposed proximate to a button or a dial used for operating the air conditioner 131.

The audio device 133 may include a control panel having a plurality of buttons operating of the audio device 133. The audio device 133 may include a radio mode for operating a radio and a media mode configured to reproduce audio files from various storage media containing the audio files. The AVN device 134 may be embedded in the center fascia 130 of the vehicle 100. The AVN device 134 may be an configured to collectively perform an audio function, a video function, and a navigation function according to a user's operation. The AVN device 134 may include a display 135 configured to display images related to the audio function, the video function, or the navigation function upon receiving a user command for the AVN device 134. In addition, the center fascia 130 may include a proximity sensor 200 configured to recognize the approach or contact (e.g., a touch) of an input device, (e.g., a user's finger or a touch pen). The proximity sensor 200 may be configured to recognize the approach and touch of an input device (e.g., of the user) based on the variation of capacitance caused by the approach and touch of the input device (e.g., of the user).

Figure 3:
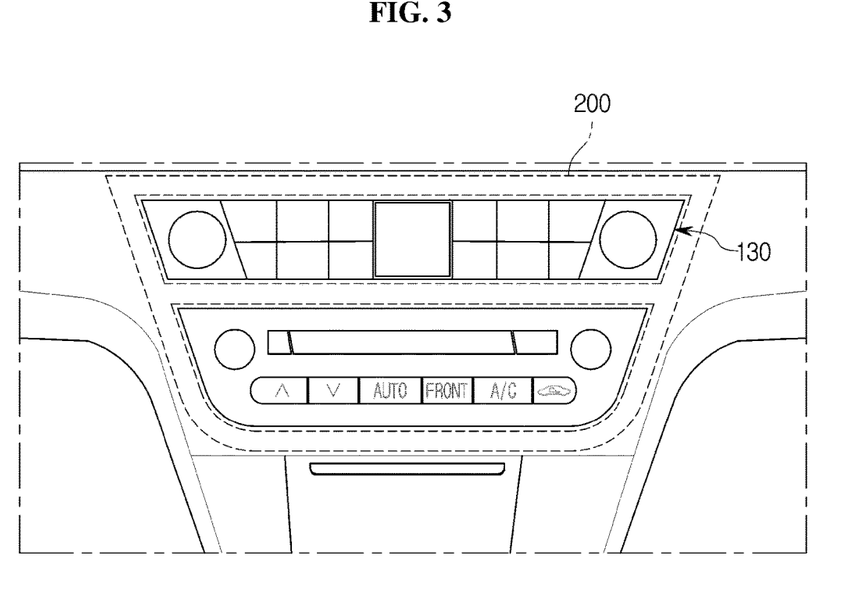
FIG. 3 is an exemplary view illustrating a proximity sensor in accordance with an exemplary embodiment of the present disclosure installed on a center fascia of the vehicle in a state before a user approaches the proximity sensor according to an exemplary embodiment of the present disclosure.
Figure 4:
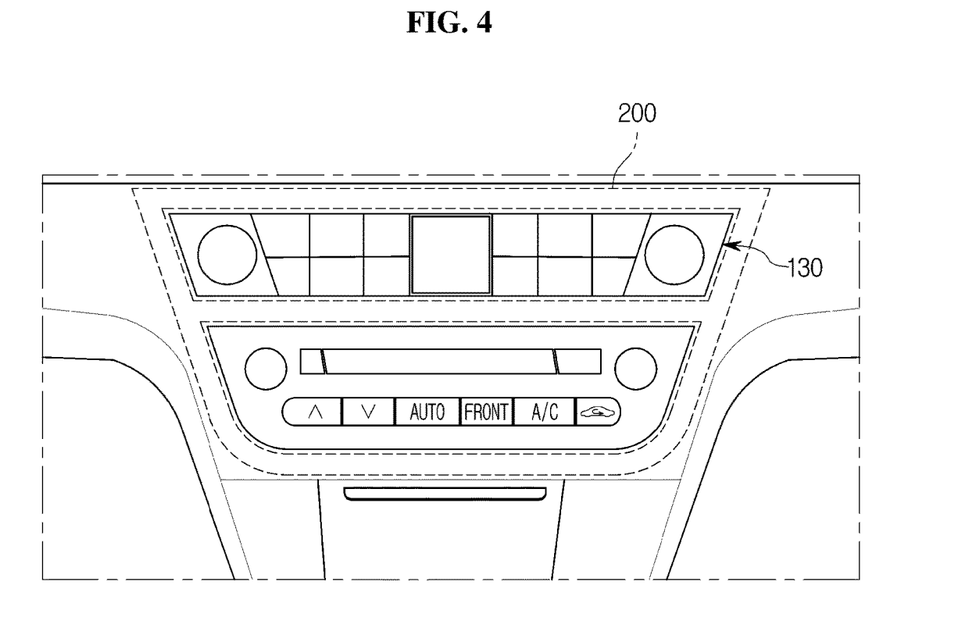
FIG. 4 is an exemplary view illustrating a state in which a user approaches the proximity sensor illustrated in FIG. 3 according to an exemplary embodiment of the present disclosure.

FIG. 3 is an exemplary view illustrating the proximity sensor in accordance with an exemplary embodiment of the present disclosure disposed on the center fascia of the vehicle before the input device approaches the proximity sensor. FIG. 4 is an exemplary view illustrating a state in which the input device approaches the proximity sensor illustrated in FIG. 3. The proximity sensor 200 may be connected to a controller (not shown). The controller may configured to operate the air conditioner 131, the audio device 133 and the AVN device 134. The proximity sensor 200 may be configured to recognize the approach of the input device and may be configured to transmit a signal related to the approach of the input device to the controller. Upon receiving the signal from the proximity sensor 200, the controller may be configured to adjust the brightness of a light emitting unit (not shown) provided in the buttons, dials, displays, etc.

For example, as illustrated in FIG. 3, the brightness of the light emitting unit provided in the buttons or dials installed in the center fascia 130 may maintain a low light condition before the input device approaches the proximity sensor 200. Accordingly, light pollution due to excessive interior lighting may be eliminated when driving during low light conditions. When driving during low light conditions, excessive indoor lighting that is not intended by the user may distract the driver's attention and may cause accidents. Therefore, it may be possible to reduce the driver distraction from occurring while driving by turning off power of the light emitting unit disposed in the buttons or the like disposed in the center fascia, which the user does not intend to use, or by reducing the brightness of the light emitting unit.

When the input device approaches the proximity sensor 200 or contacts the proximity sensor 200, the brightness of the light emitting unit disposed in the center fascia 130 may be increased as shown in FIG. 4. Thus, the user may more easily recognize the position or the state of each button more easily. Accordingly, when the user intends to operate the light emitting unit, the light pollution does not interfere with the driver even when the brightness of the light emitting unit increases, and the driver may more easily recognize the location of the buttons. Further, since the proximity sensor 200 may be configured to display a current state of functions in response to the approach of the user, a sense of a cutting edge technology, and a high quality interior increase consumer satisfaction. According to an aspect of the present disclosure, an exterior surface of the proximity sensor 200 may be formed of a metal material.

Recently, users tend to prefer metal materials for decoration of an interior of a vehicle. For example, current consumer trends consider a preference for metal due to the luxurious image of metals. Accordingly, attempts have been made to use a metal material on an exposed exterior surface of the proximity sensor. However, in conventional infrared sensor, when an impermeable substance, such as a metal, is disposed in front of the infrared sensor, an infrared ray does not pass through the impermeable substrate. Accordingly, the use of the infrared sensor is limited. The proximity sensor 200 according to an exemplary embodiment of the present disclosure may include a capacitive type proximity sensor IC. In particular, to the operational concerns related to the impermeability of the metal are resolved. Hereinafter, a structure of the proximity sensor according to various exemplary embodiments of the present disclosure will be described in detail.

Figure 5:
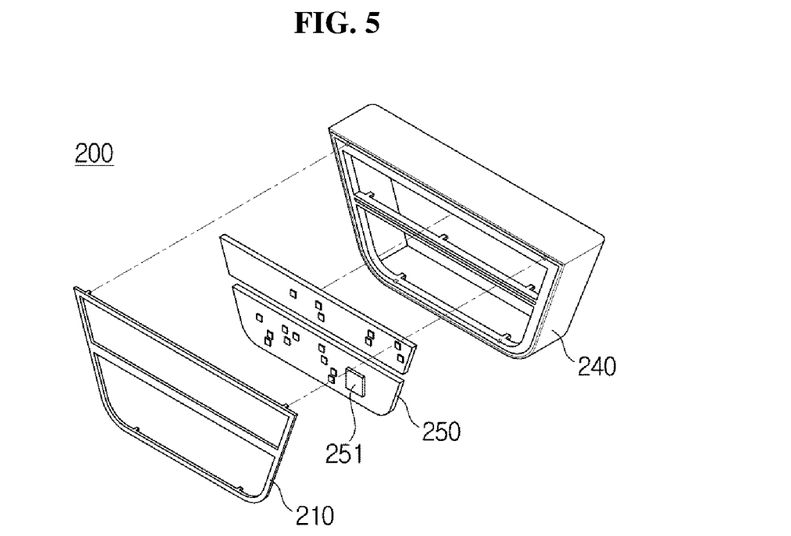
FIG. 5 is an exemplary exploded view of a proximity sensor in accordance with an exemplary embodiment of the present disclosure.

FIG. 5 is an exemplary an detailed view of the proximity sensor in accordance with an exemplary embodiment of the present disclosure. As illustrated in 5, the proximity sensor 200 may include a frame 210 disposed to be exposed to an exterior of the center fascia 130, a panel 240 coupled to a back surface of the frame 210 to support the frame 210, a printed circuit board 250 disposed in the panel 240, and a sensor IC 251 mounted on the printed circuit board 250.

Although not specifically shown in the drawing, a metal layer 220 may be disposed on an exterior surface of the frame 210. Further, a sensor electrode 230 connected to the sensor IC 251 may be provided. The sensor electrode 230 may be connected to the printed circuit board 250 and may be connected to the sensor IC 251 through the printed circuit board 250. The frame 210 may be formed of a nonconductive material. For example, the frame 210 may be formed of a plastic material and may be manufactured through injection molding. There is no restriction on the shape of the frame 210, and a part of the frame 210 may have a curved surface or a bent surface.

Meanwhile, according to an exemplary embodiment, the frame 210 may include various buttons provided on the center fascia 130 or a bezel forming an exterior rim of a display. When the sensor IC may recognize the approach of a user to the bezel, the sensor IC may also be configured to recognize the approach of the user moving to touch a button or a touch part disposed inside the bezel. In other words, when the proximity sensor is provided in the bezel, the approach of the input device to the button may be recognized even when the proximity sensor is not disposed in the button.

The frame 210 may be exposed to the exterior of the center fascia 130. To meet the current needs of users who prefer metal materials, the frame 210 may be formed of a metal material. When the frame 210 is entirely formed of a metal material, the weight of the frame 210 may be increases and costs may increase, thus causing an increase in production costs. For example, metal plating or ion plating evaporation (WE) may be performed on an exterior surface of the frame 210 after the frame 210 is formed through injection molding using a plastic material. For example, chromium plating may be performed. Accordingly, a metal layer 220 including a metal material may be formed on the exterior surface of the frame 210 exposed to the exterior of the center fascia 130. Since the exterior surface of the frame 210 is formed of a metal material, an interior of the vehicle may be enhanced in terms of quality and aesthetics.

Figure 6:
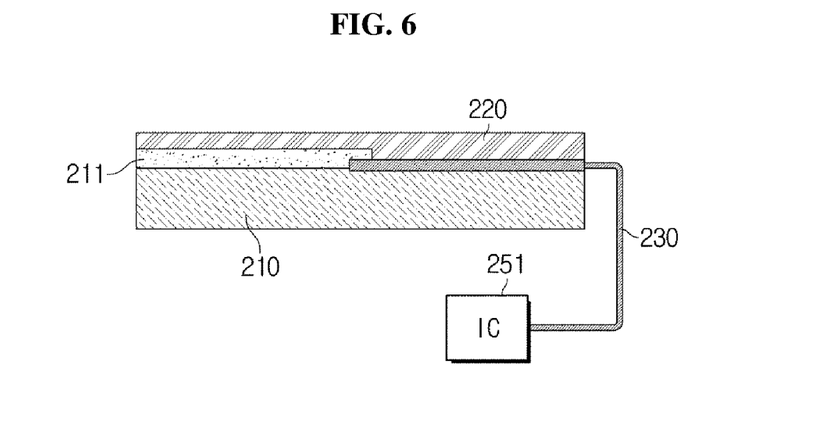
FIG. 6 is an exemplary conceptual view illustrating a cross section of a frame in accordance with an exemplary embodiment of the present disclosure in the proximity sensor of FIG. 5.

FIGS. 6 to 9 are conceptual views illustrating cross sections of a frame in accordance with exemplary embodiments of the present disclosure in the proximity sensor of FIG. 5. As shown in FIG. 6, a sensor electrode 230 may be formed on a side of a frame 210. In particular, the sensor electrode 230 may be formed using a laser directing structure (LDS) technique. According to the LDS technique, a support material may be prepared using a material containing a non-conductive and chemically stable metal complex, and a part of the support material may be exposed to a laser such as an ultraviolet (UV) laser or an excimer laser to expose a metal seed by decomposing a chemical bond of the metal complex. Then, the support material may be metallized to form a conductive structure on a portion of the support material exposed to the laser.

The frame 210 may be formed from a material including a metal complex. An electrode groove (not shown) may be formed in the frame 210 by exposing the frame 210 to a laser, and the sensor electrode 230 may be formed by metallizing the electrode groove. The sensor electrode 230 may be disposed on a part of an exterior surface of the frame 210. An area where the sensor electrode 230 may be disposed on the exterior surface of the frame 210 may be a less than an area compared to the entire exterior surface of the frame 210.

A primer layer 211 may be formed on the frame 210 except in a partial area of the frame 210 where the sensor electrode 230 is disposed. The primer layer 211 may be configured to more stably bond the metal layer 220 and the frame 210, and may provide a type of adhesive. The primer layer 211 may be disposed on the frame 210 before the metal layer 220 is formed. The primer layer 211 may be formed over an area greater than an area of the frame 210 on which the sensor electrode 230 is provided.

Although FIG. 6 illustrates a state in which a portion of the primer layer 211 covers the sensor electrode 230, the exemplary embodiment is not limited thereto. The primer layer 211 and the sensor electrode 230 may not overlap each other. The primer layer 211 may be disposed on a part of an exterior surface of the frame 210. A metal plating region or a metal deposition region for forming the metal layer 220 may be disposed to be greater than a primer region for forming the primer layer 211.

The metal layer 220 may cover the primer layer 211 and the sensor electrode 230. Since the sensor electrode 230 and the metal layer 220 are in physical contact with each other, the sensor electrode 230 and the metal layer 220 may be formed of a conductive metal material and may be electrically connected to each other. Accordingly, the sensor IC 230 may be configured to detect the approach or contact of the input device on the metal layer 220, which is electrically connected to the sensor electrode 230, as well as the approach or contact of the input device on the sensor electrode 230. In particular, the metal layer 220 may provide a sensing part.

Further, the sensor electrode 230 formed on the frame 210 may be connected to the printed circuit board 250 and connected to the sensor IC 251, mounted on the printed circuit board 250, through the printed circuit board 250. The sensor electrode 230 may be connected to the printed circuit board 250 in a plurality of ways. Although not shown in the drawings, the proximity sensor 200 may include a flexible printed circuit board configured to connect the sensor electrode 230 formed on the frame 210 to the printed circuit board 250.

Figure 7:
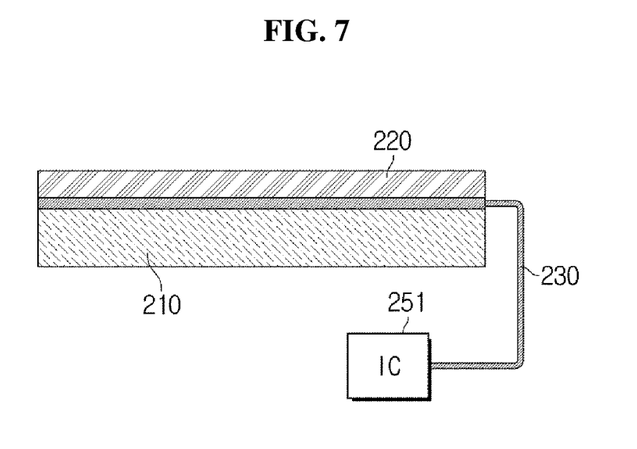
FIG. 7 is an exemplary conceptual view illustrating a cross section of a frame in accordance with an exemplary embodiment of the present disclosure in the proximity sensor of FIG. 5.

As shown in FIG. 7, a sensor electrode 230 may be formed on an exterior surface of a frame 210, and a metal layer 220 may be formed on an upper surface of the sensor electrode 230 without the primer layer. In particular, adhesive force between the metal layer 220 and the sensor electrode 230 or the frame 210 may be relatively weak due to the lack of the primer layer, but productivity may be improved since a process for forming the primer layer may be omitted.

Figure 8:
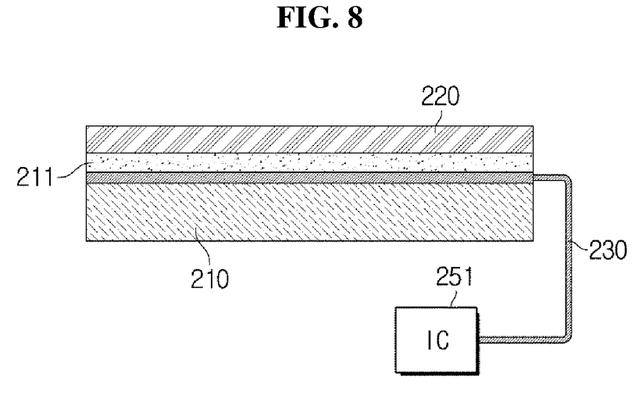
FIG. 8 is an exemplary conceptual view illustrating a cross section of a frame in accordance with another exemplary embodiment of the present disclosure in the proximity sensor of FIG. 5.

As illustrated in FIG. 8, a primer layer 211 may be formed on an upper surface of a sensor electrode 230, and a metal layer 220 may be formed on an upper surface of the primer layer 211. In particular, since the primer layer 211 is disposed, the metal layer 220 may be bonded more stably to the frame 210 or the sensor electrode 230. When the primer layer 211 has a very thin thickness, the metal layer 220 may provide a sensing part even when there is no physical contact between the metal layer 220 and the sensor electrode 230. However, the sensing sensitivity may decrease as compared with when the metal layer 220 comes into physical contact with the sensor electrode 230.

Figure 9:
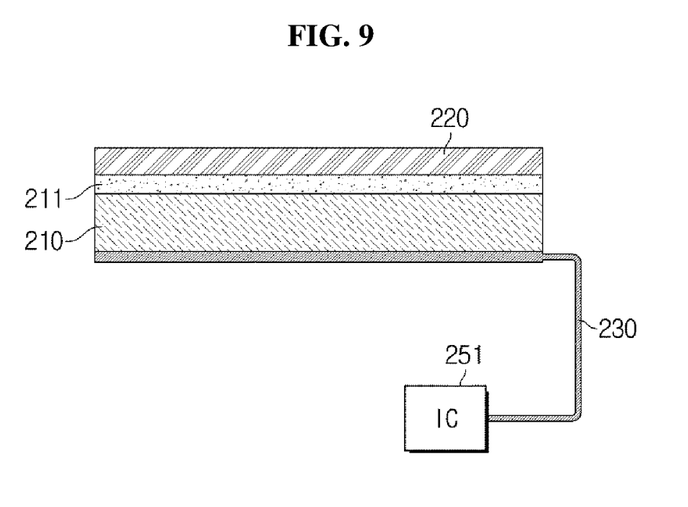
FIG. 9 is an exemplary conceptual view illustrating a cross section of a frame in accordance with yet another exemplary embodiment of the present disclosure in the proximity sensor of FIG. 5.

FIG. 9 is an exemplary conceptual view illustrating a cross section of a frame in accordance with another exemplary embodiment of the present disclosure in the proximity sensor of FIG. 5. As illustrated in FIG. 9, a metal layer 220 may be disposed on an exterior surface of a frame 210, and a sensor electrode 230 may be disposed on an interior surface of the frame 210. In other words, the metal layer 220 may be disposed on a first side of the frame 210, and the sensor electrode 230 may be disposed on a second side of the frame 210.

Similarly to FIGS. 6 to 8, the sensor electrode 230 may be connected to a printed circuit board 250 through exemplary embodiments. The sensor electrode 230 may be formed on the frame 210 through an LDS scheme. The sensor electrode 230 and the metal layer 220 may be spaced apart by a thickness of the frame 210. In particular, when a thickness of the frame 210 is a fixed value, a capacitance generated between the metal layer 220 and the sensor electrode 230 may be constant. However, a capacitance occurring between a user and the metal layer 220 may vary based on a distance between the user and the metal layer 220. Accordingly, when a distance between the user and the metal layer 220 varies, a capacitance at the sensor electrode 230 may vary. The sensor IC 251 may be configured to sense the variation of capacitance of the sensor electrode 230. Thus, the sensor IC 251 may be configured to recognize the approach or the contact of the input device on the metal layer 220 by sensing the variation of capacitance even when the variation of capacitance at the sensor electrode 230 is minimal.

Figure 10:
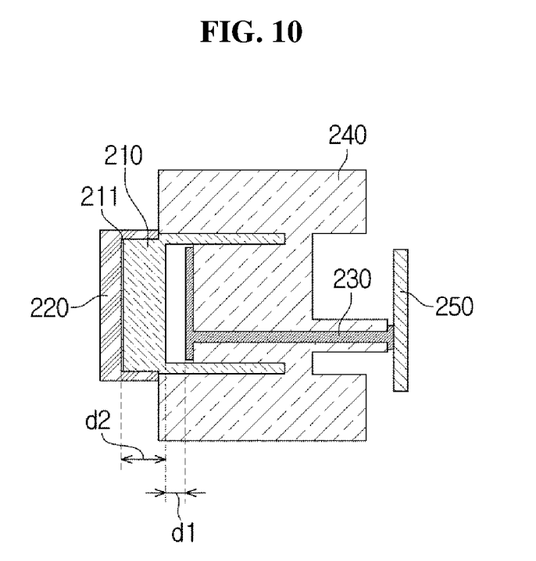
FIG. 10 is an exemplary conceptual view illustrating a cross section of the proximity sensor of FIG. 5.

FIG. 10 is an exemplary conceptual view illustrating a cross section of the proximity sensor shown in FIG. 5. As shown in FIG. 10, the sensor electrode 230 may be formed on a first side of the panel 240. In particular, the sensor electrode 230 may be formed on one surface of the panel 240 facing the frame 210. The sensor electrode 230 may be formed through an LDS scheme. In other words, the panel 240 may be formed of a material including a metal complex.

The sensor electrode 230 may be spaced a predetermined distance from the metal layer 220. As illustrated in FIG. 10, when the frame 210 and the sensor electrode 230 are spaced apart by a distance d1 and a thickness of the frame 210 is a thickness d2, the sensor electrode 230 and the metal layer 220 may be spaced apart by d1+d2. In particular, when the thickness d2 of the frame 210 is a fixed value and the distance d1 between the sensor electrode 230 and the frame 210 is a fixed value, d1+d2 may be a fixed value. Therefore, a capacitance generated between the metal layer 220 and the sensor electrode 230 may be constant. Additionally, a capacitance generated between the user and the metal layer 220 may vary based on a distance between the user and the metal layer 220. Accordingly, as the distance between the user and the metal layer 220 varies, the capacitance at the sensor electrode 230 may vary. The sensor IC 251 may be configured to sense the variation of capacitance of the sensor electrode 230. Thus, the sensor IC 251 may be configured to recognize the approach or contact of the input device on the metal layer 220 by sensing the variation of capacitance even when the variation of capacitance at the sensor electrode 230 is minimal.

Further, an air layer may be formed in an empty cavity between the sensor electrode 230 and the frame 210. When the air layer is formed between the sensor electrode 230 and the frame 210, even when high voltage is instantaneously generated in the metal layer 220 due to static electricity or the like, the high voltage being transmitted to the sensor electrode 230 and the sensor IC 251 may be low. Therefore, there is an advantage that the possibility of damaging the sensor IC 251 due to static electricity may be significantly reduced. In other words, durability or stability may be improved.

Figure 11:
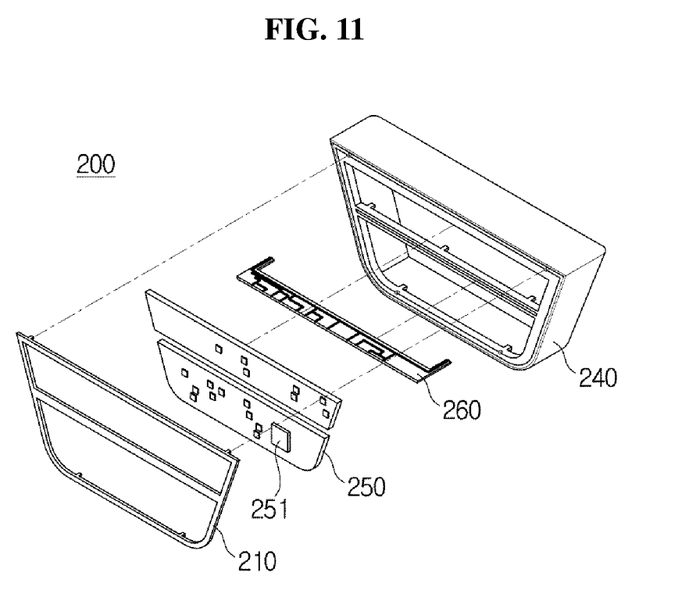
FIG. 11 is an exemplary exploded view of a proximity sensor in accordance with another exemplary embodiment of the present disclosure.
Figure 12:
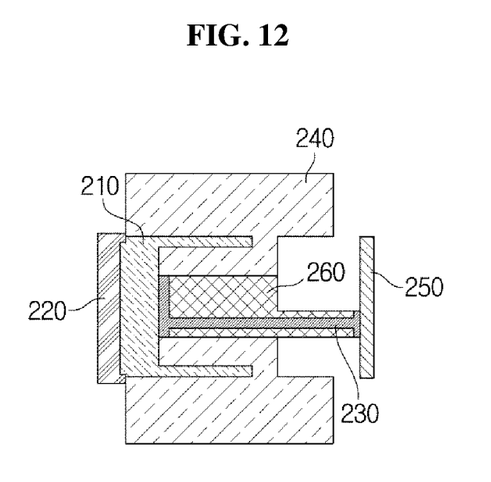
FIG. 12 is an exemplary conceptual view illustrating a cross section of the proximity sensor of FIG. 11 according to an exemplary embodiment of the present disclosure.

FIG. 11 is an exemplary exploded view of a proximity sensor in accordance with another exemplary embodiment of the present disclosure. FIG. 12 is an exemplary conceptual view illustrating a cross section of the proximity sensor of FIG. 11. As illustrated in FIG. 11, according to another exemplary embodiment of the present disclosure, a proximity sensor 200 may include a frame 210, a metal layer 220 formed on an exterior surface of the frame 210, a panel 240 coupled to the frame 210, a sensor electrode base 260 including a sensor electrode 230 and coupled to the panel 240, a printed circuit board 250 accommodated in the panel 240, and a sensor IC 251 mounted on the printed circuit board 250.

According to an exemplary embodiment, the proximity sensor 200 may include the sensor electrode base 260 disposed separately from the panel 240 and coupled to the panel 240. The sensor electrode base 260 may include the sensor electrode 230. The sensor electrode base 260 may be coupled to the panel 240 to connect the sensor electrode 230 to the printed circuit board 250. The sensor electrode 230 formed on the sensor electrode base 260 may be formed through an LDS scheme. In particular, the sensor electrode base 260 may be formed of a material that includes a metal complex.

As illustrated in FIG. 12, when the sensor electrode base 260 is coupled to the panel 240, the sensor electrode base 260 may contact a rear surface of the frame 210. In particular, the sensor electrode 230 may be provided to contact the rear surface of the frame 210. The metal layer 220 may be formed on a front surface of the frame 210 through metal plating or metal deposition. The metal layer 220 may be formed after a primer layer (not shown) is formed on a front surface of the frame 210. As described above, the primer layer may be provided for stable coupling between the metal layer 220 and the frame 210, but the primer layer may be omitted if necessary.

The sensor electrode 230 and the metal layer 220 may be spaced apart from each other by a thickness of the frame 210. In particular, since the thickness of the frame 210 is a fixed value, a capacitance generated between the metal layer 220 and the sensor electrode 230 may be constant. Additionally, a capacitance generated between the user and the metal layer 220 may vary based on a distance between the user and the metal layer 220. Accordingly, the capacitance at the sensor electrode 230 may vary as the distance between the user and the metal layer 220 changes. The sensor IC 251 may be configured to sense the variation of capacitance of the sensor electrode 230. Thus, the sensor IC 251 may be configured to recognize the approach or contact of the input device on the metal layer 220 by sensing the variation of capacitance even when the variation of capacitance at the sensor electrode 230 decreases.

Additionally, although not shown in the drawing, an air layer may be formed between the sensor electrode 230 and a rear surface of the frame 210 even when the sensor electrode base 260 is provided. As described above, when the air layer is formed, the possibility of damaging the sensor IC 251 may be reduced to improve the durability of the sensor IC 251. When the sensor electrode base 260 is provided separately from the panel 240, production costs may be reduced and productivity may be improved.

In particular, formation of a sensor electrode on the sensor electrode base 260 which has a simplified structure may be more easily preformed and repaired, compared to when a sensor electrode is formed by irradiating the panel with a laser after fixing the panel 240 having a relatively complicated structure. In other words, the production of the proximity sensor may be improved since the sensor electrode may be formed on a sensor electrode base, which has a reduced volume and may be more easily processed, instead of a panel which has a greater volume and is difficult to process for forming the sensor electrode. Meanwhile, the sensor electrode base 260 may be more easily coupled to the panel 240 by insertion-coupling or the like.

Additionally, to form the sensor electrode on the panel 240 having a relatively large volume by an LDS scheme, the entire panel 240 may be formed of a material including a metal complex. In contrast, the sensor electrode base 260 may have a smaller volume than the panel 240. Accordingly, an increase in the production costs of the sensor electrode base 260 may be minimal even when the sensor electrode base 260 is formed of a material including a metal complex. Further, the sensor electrode base 260 may be commonly used for panels having various shapes, so that mass production is possible, thereby reducing the production costs. However, a distance between the metal surface and the sensor electrode may be constant after the proximity sensor has been packaged. Similar to a capacitance C1, a capacitance between a metal surface and the sensor electrode may be determined based on the distance between the metal surface and the sensor electrode. Therefore, a capacitance C2 may have a constant value regardless of the approach of an inputter.

As is apparent from the above description of the exemplary embodiments, a proximity sensor may have an exterior formed of a metal material to improve the aesthetics. A proximity sensor may be more easily designed with a simplified structure. A proximity sensor, which does not require a separate installation cavity, may improve utilization. A proximity sensor with improved material selection and design freedom may be provided.

Although exemplary embodiments of the present disclosure have been shown and described, it would be appreciated by those skilled in the art that changes may be made in these exemplary embodiments without departing from the principles and spirit of the disclosure, the scope of which is defined in the claims and their equivalents.

What is claimed is:

1. A proximity sensor disposed in an input device of a center fascia mounted within a vehicle to control the vehicle operations in response to detection of an approach of a user's finger to the input device, comprising:

a panel disposed in the center fascia of the vehicle;
a frame formed of a nonconductive material and coupled to the panel via a back surface of the frame;
a metal layer disposed to cover an exterior surface of the frame;
a sensor electrode spaced a predetermined distance from the frame forming an air gap between the frame and the sensor electrode;
a sensor electrode base including the sensor electrode coupled to the panel; and
a sensor integrated circuit (IC) mounted on a printed circuit hoard accommodated in the panel and connected to the sensor electrode to sense the approach of the user's finger to the metal layer or a contact to the metal layer of the input device, wherein
the sensor IC senses a capacitance variation at the sensor electrode based on a distance between the user's finger and the metal layer to recognize the approach of the user's finger to the input device;
the exterior surface of the frame is disposed on an outside of the center fascia forming an outer appearance of the proximity sensor, and
an area of the metal layer is larger than an area of the sensor electrode.

2. The proximity sensor according to claim 1, further comprising:
a primer layer disposed between the metal layer and the exterior surface of the frame.

3. The proximity sensor according to claim 2, wherein an area of the primer layer is larger than the area of the sensor electrode and smaller than the area of the metal layer.

4. The proximity sensor according to claim 1, wherein the frame includes a metal complex; and the sensor electrode is formed by metallizing an electrode groove formed by irradiating the frame with a laser.

5. The proximity sensor according to claim 1, wherein the metal layer is formed by plating or deposition of a metal on the exterior surface of the frame.

6. The proximity sensor according to claim 1, wherein at east a portion sensor electrode is formed on a flexible printed circuit board.

* * * * *